(12) United States Patent
Park et al.

(10) Patent No.: US 7,529,960 B2
(45) Date of Patent: May 5, 2009

(54) APPARATUS, SYSTEM AND METHOD FOR GENERATING SELF-GENERATED STROBE SIGNAL FOR PERIPHERAL DEVICE

(75) Inventors: Hyun-Sang Park, Cheonan-si (KR); Suk-Ki Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 454 days.

(21) Appl. No.: 11/317,131

(22) Filed: Dec. 22, 2005

(65) Prior Publication Data
US 2006/0140047 A1 Jun. 29, 2006

(30) Foreign Application Priority Data
Dec. 23, 2004 (KR) .................. 10-2004-0110838

(51) Int. Cl.
*G06F 1/04* (2006.01)
(52) U.S. Cl. ...................... 713/500; 713/502
(58) Field of Classification Search ............. 713/500, 713/502
See application file for complete search history.

(56) References Cited

U.S. PATENT DOCUMENTS

| 4,785,469 | A * | 11/1988 | Joshi et al. .................. 375/366 |
| 6,442,642 | B1 * | 8/2002 | Brooks ....................... 710/305 |
| 6,996,032 | B2 * | 2/2006 | Ganry ......................... 368/118 |

* cited by examiner

*Primary Examiner*—Tse Chen
(74) *Attorney, Agent, or Firm*—Mills & Onello LLP

(57) ABSTRACT

A self-generated strobe signal generator generates a self-generated strobe signal for a peripheral device using a peripheral device selection signal and a clock signal, without using a conventional strobe signal for all of the peripheral devices. Using the self-generated strobe signal synchronized to the clock signal, a delay time of the conventional strobe signal due to a high fan-out capability requirement and a long path length may be reduced and an operating frequency of an entire system may be improved.

10 Claims, 7 Drawing Sheets

APPARATUS, SYSTEM AND METHOD FOR GENERATING SELF-GENERATED STROBE SIGNAL FOR PERIPHERAL DEVICE

CLAIM FOR PRIORITY

This application claims priority to Korean Patent Application No. 10-2004-0110838 filed on Dec. 23, 2004 in the Korean Intellectual Property Office, the entire contents of which are herein incorporated by reference.

BACKGROUND OF THE INVENTION

1. Field of the Invention

The present invention relates to an advanced microcontroller bus architecture (AMBA) bus system of an system-on-chip (SOC) and in particular to a method of generating a strobe signal of a peripheral device.

2. Description of the Related Art

The Advanced Microcontroller Bus Architecture bus specification, introduced by ARM, Ltd., is an open-standard bus specification that includes a method of coupling function blocks, such as a central processing unit (CPU) of an SOC, or a digital signal processor (DSP), and a method of managing the function blocks.

The AMBA bus specification defines a common system bus, i.e., backbone, for internal modules of the SOC, and enhances efficiency of the system design.

The AMBA bus specification includes the advanced high-performance bus (AHB), the advanced system bus (ASB) and the advanced peripheral bus (APB).

FIG. 1 is a block diagram illustrating a conventional AMBA bus system.

Referring to FIG. 1, the AMBA bus system includes an external memory interface 10, an ARM processor 12, an on-chip random-access memory (RAM) 14, a direct memory access (DMA) bus master 16, a main bus 20, a bridge 30, a peripheral bus 50, and peripheral devices, such as a universal asynchronous receiver/transmitter (UART) 40, a timer 42, a keypad 44, and a programmed input/output (PIO) 46.

The main bus 20 employs the AHB or the ASB, and couples the ARM processor 12, the on-chip memory 14 and the DMA bus master 16.

The AHB and the ASB are high-performance buses that provide pipeline operation, burst operation, and multiple bus masters.

The peripheral bus 50 employs the APB, and couples the UART 40, the timer 42, the keypad 44 and the PIO 46.

The APB is characterized by low power consumption and control of latched addresses, and provides a simple interface between the peripheral devices.

The bridge 30 as a bus master controls data transfer between system devices coupled to the main bus 20 and the peripheral devices coupled to the peripheral bus 50.

FIG. 2 is a block diagram illustrating signal transfer between the bus master (or bridge) and the peripheral devices according to the conventional bus system shown in FIG. 1.

Referring to FIG. 2, the bus master 30 is synchronized to a clock signal PCLK to provide to the peripheral devices a plurality of selection signals PSEL1 through PSELn for selecting the peripheral devices such as the UART 40, the timer 42, the keypad 44 and the PIO 46; a strobe signal PENABLE for controlling input/output of all of the peripheral devices; an address signal PADDR for indicating a location of a register used for storing data; and a plurality of control signals such as a read/write mode control signal PWRITE.

In addition, the bus master 30 transmits/receives write data PWDATA with the corresponding control signal during a write mode to/from the peripheral devices, and read data PRDATA with the corresponding control signal during a read mode to/from the peripheral devices.

That is, the peripheral device selected by the corresponding selection signal transmits/receives, according to an operation mode, the read data PRDATA and the write data PWDATA in response to the control signals provided through the bus master 30.

FIG. 3 is a timing diagram illustrating an operation of the bus system shown in FIG. 1 during a data read mode.

Referring to FIGS. 2 and 3, the bus master 30 generates a valid address signal PADDR, a read/write mode control signal PWRITE, and a selection signal PSEL at a second clock cycle T2, and the bus master 30 generates a strobe signal PENABLE at a third clock cycle T3.

By an activation of the strobe signal PENABLE, read data PRDATA outputted from the selected peripheral device are transmitted to the bus master 30, and the bus master 30 reads the read data PRDATA at a fourth clock cycle T4.

In the timing diagram shown in FIG. 3, the address signal PADDR, the read/write mode control signal PWRITE and the selection signal PSEL are provided stably for two cycles before the read data PRDATA are inputted to the bus master 30; thus, these control signals do not affect data transmission delay through the peripheral bus 50.

The data transmission delay is actually affected by the strobe signal PENABLE. Because the strobe signal PENABLE generated by the bus master 30 is commonly inputted to all of the peripheral devices based on the APB bus protocol, a high fan-out capability is required, and because some peripheral devices may be far from the bus master 30, a path length to a remote peripheral device becomes long. As a result, the strobe signal PENABLE causes the prolonged data transmission delay due to the high fan-out capability requirement and the long path length.

In the timing diagram shown in FIG. 3, the reference symbol 't1' represents a delay time during which the strobe signal PENABLE is transmitted to one of the peripheral devices from the bus master 30.

The reference symbol 't2' represents a set-up time period required beforehand in order that the bus master 30 may read valid data during a fourth clock cycle T4, and the set-up time period t2 is decreased by an amount as much as the delay time t1.

Because the delayed strobe signal PENABLE also delays data transfer through the peripheral bus 50, a critical path of an entire system is formed to limit a maximum operating frequency.

Further, as size of the SOC increases and operating frequency becomes higher, the delay time resulting from the strobe signal PENABLE decreases efficiency of the entire system.

SUMMARY OF THE INVENTION

Accordingly, the present invention is provided to substantially obviate one or more problems due to limitations and disadvantages of the related art.

Embodiments of the present invention provide a device, a system and a method for generating a self-generated strobe signal capable of reducing a delay time and capable of improving an operating frequency using peripheral device selection signals and a clock signal, without using a strobe signal that operates all of the peripheral devices.

According to one aspect, the present invention is directed to a bus system which includes: a bus master, coupled between a main bus and a peripheral bus, configured to generate a peripheral device selection signal, a read/write mode control signal and an address signal in response to a clock signal, the peripheral device selection signal being used for transferring data between the main bus and a plurality of peripheral devices coupled to the peripheral bus; and a self-generated strobe signal generator configured to generate a self-generated strobe signal for controlling the data input/output of the plurality of the peripheral devices in response to the peripheral device selection signal and the clock signal.

In one embodiment, the self-generated strobe signal is provided only to the peripheral device selected by the peripheral device selection signal.

In one embodiment, the self-generated strobe signal generator receives the peripheral device selection signal during a first clock cycle of the clock signal, and generates the self-generated strobe signal in response to a second clock cycle of the clock signal, the second clock cycle following the first clock cycle.

In one embodiment, the self-generated strobe signal generator comprises: a logical AND circuit configured to operate in response to the peripheral device selection signal and an inverted signal of the self-generated strobe signal; and a flip-flop configured to receive an output signal of the logical AND circuit, and configured to operate in response to the clock signal.

According to another aspect, the present invention is directed to a self-generated strobe signal generator which includes: a logical AND circuit configured to receive a peripheral device selection signal and an inverted signal of a self-generated strobe signal; and a flip-flop configured to receive an output signal of the logical AND circuit to operate in response to a clock signal, and configured to generate the self-generated strobe signal and the inverted signal of the self-generated strobe signal that are used for controlling data input/output of a peripheral device selected by the peripheral device selection signal.

In one embodiment, the peripheral device selection signal is inputted during a first clock cycle of the clock signal, and the self-generated strobe signal is generated during a second clock cycle following the first clock cycle.

According to another aspect, the present invention is directed to a method of generating a self-generated strobe signal for peripheral devices which includes: performing a logical AND operation on a peripheral device selection signal and an inverted signal of a self-generated strobe signal to store a signal resulting from the logical AND operation, the peripheral device selection signal being synchronized with a first clock cycle of a clock signal; and outputting the self-generated strobe signal for controlling data input/output of a peripheral device using the stored signal in response to the clock signal during a second clock cycle following the first clock cycle.

In one embodiment, the self-generated strobe signal is activated in response to an activation of the peripheral device selection signal.

In one embodiment, the signal resulting from the logical AND operation is stored in a flip-flop after performing the logical AND operation on the peripheral device selection signal and the inverted signal in an inactive state during the first clock cycle.

In one embodiment, the self-generated strobe signal is provided only to the peripheral device selected by the peripheral device selection signal.

In one embodiment, the peripheral device selection signal is provided from a bus master, and the clock signal, which is used as a common clock signal during the step of storing the signal resulting from the logical AND operation and during the step of outputting the self-generated strobe signal, is used as the common clock signal of the bus master and the peripheral device selected by the peripheral device selection signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Detailed illustrative embodiments of the present invention are disclosed herein. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

Figure 4:
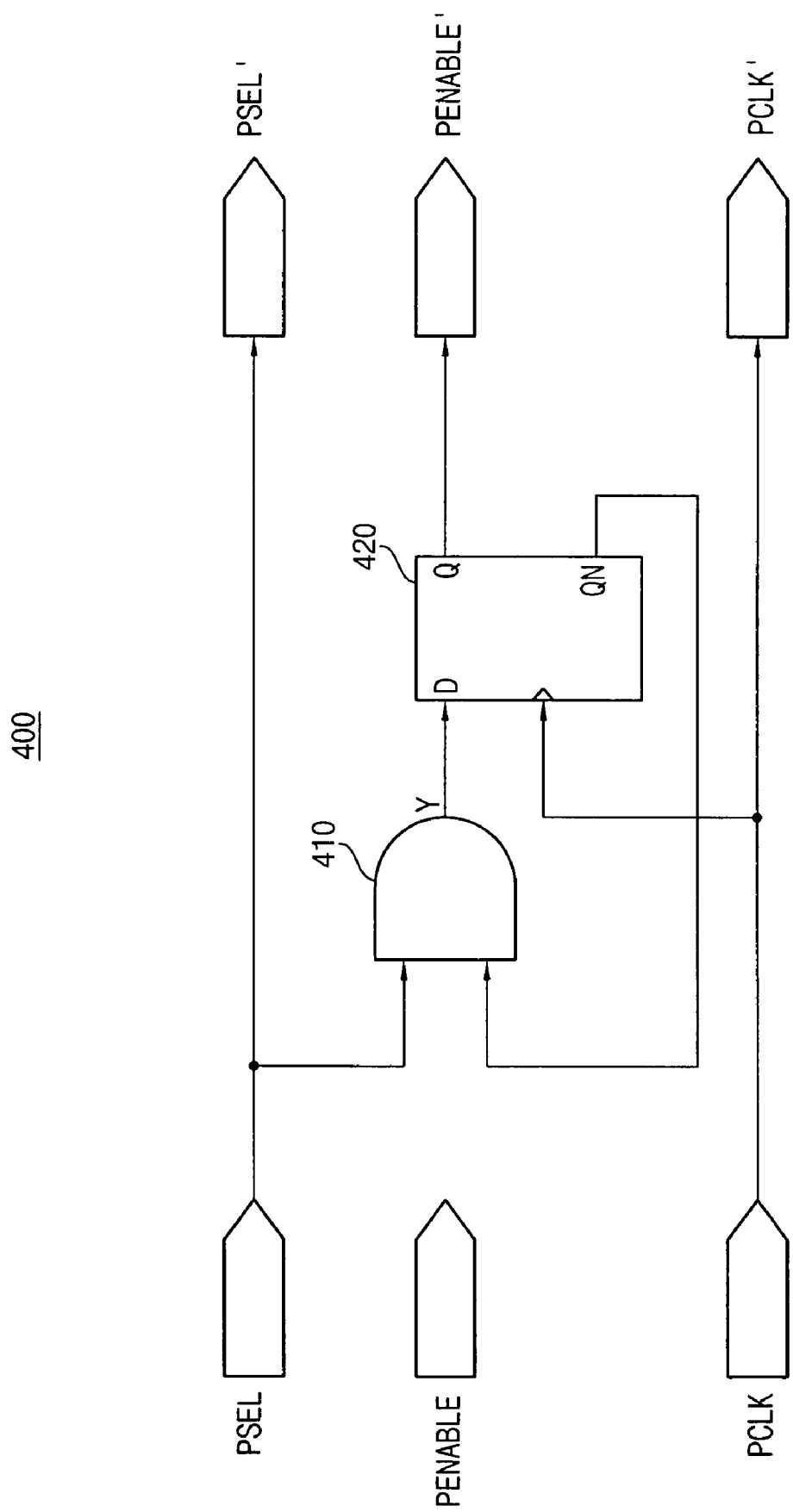
FIG. 4 is a circuit diagram illustrating a self-generated strobe signal generator according to an example embodiment of the present invention.

FIG. 4 is a circuit diagram illustrating a self-generated strobe signal generator according to an example embodiment of the present invention.

Referring to FIG. 4, the self-generated strobe signal generator 400 includes a logical AND circuit 410 and a flip-flop 420.

The logical AND circuit 410 performs a logical AND operation in response to a peripheral device selection signal PSEL and an inverted signal of a self-generated strobe signal PENABLE' outputted from the flip-flop 420.

The flip-flop 420 operates with an output signal Y of the logical AND circuit 410 and a clock signal PCLK to generate the self-generated strobe signal PENABLE' and the inverted signal of the self-generated strobe signal PENABLE'.

In example embodiments of the present invention, the self-generated strobe signal PENABLE', which is only transmitted to a corresponding peripheral device, is generated instead of using the strobe signal PENABLE for all of the peripheral devices.

Figure 5:
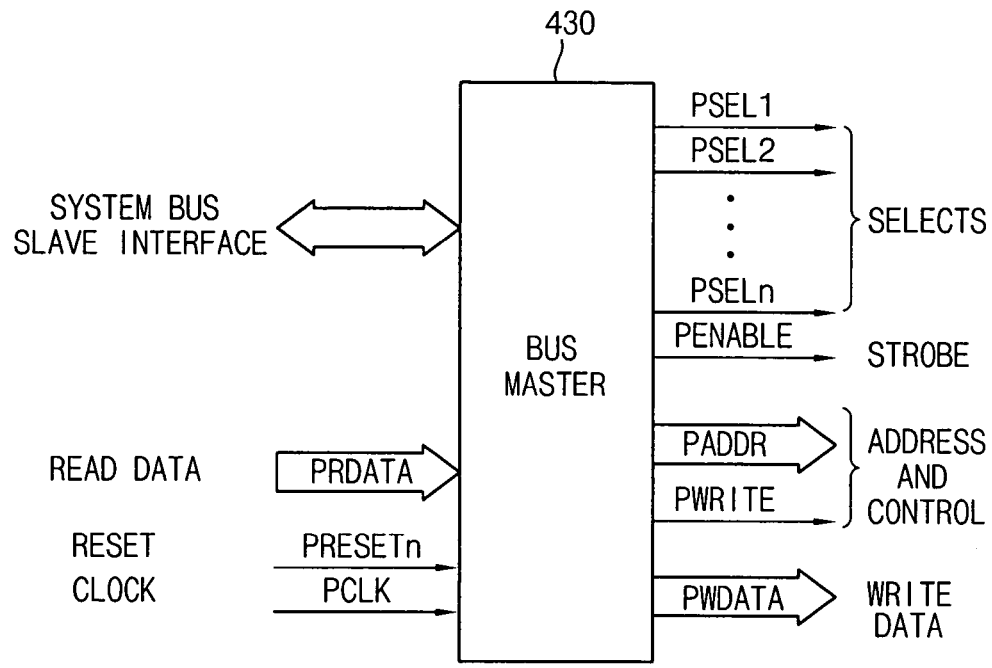
FIG. 5 is a block diagram illustrating signal transfer between a bus master (or bridge) and peripheral devices.
Figure 5:
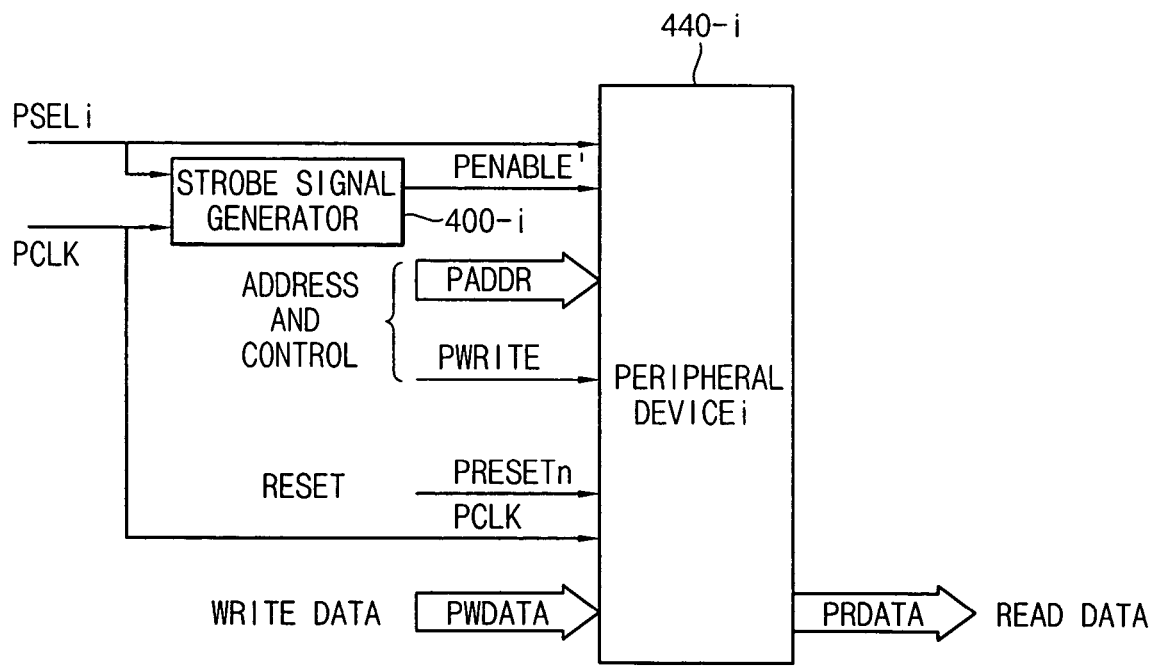

FIG. 5 is a block diagram illustrating signal transfer between a bus master (or bridge) and peripheral devices.

Referring to FIG. 5, the bus master 430 transmits peripheral device selection signals PSEL1, PSEL2, . . . , PSELn for selecting a plurality of peripheral devices 440-1, 440-2, 440-3, 440-4 (shown in FIG. 6), . . . , 440-n, a strobe signal PENABLE for controlling data input/output of a portion of the peripheral devices, an address signal PADDR for indicating a location of a register used for storing data and various control signals such as a read/write mode control signal PWRITE to the plurality of peripheral devices 440-1, 440-2, 440-3, 440-4 (shown in FIG. 6), . . . , 440-n (not shown) in response to a clock signal PCLK.

The bus master 430 transmits write data with the control signals to a selected peripheral device during a write mode, and receives read data PRDATA from the selected peripheral device during a read mode.

The peripheral device selected by the peripheral device selection signal transmits/receives the read data PRDATA and the write data PWDATA in response to the control signals received through the bus master 30.

The self-generated strobe signal PENABLE' generated by the self-generated strobe signal generator 400 is provided as a data input/output control signal for a corresponding peripheral device 440-i.

The peripheral device selection signal PSEL and the clock signal PCLK are identically provided based on the conventional APB (Advanced Peripheral Bus) bus protocol; thus, the bus system according to the example embodiment of the present invention may be easily implemented without modifying the bus master 30 (or the conventional APB bus protocol).

Figure 6:
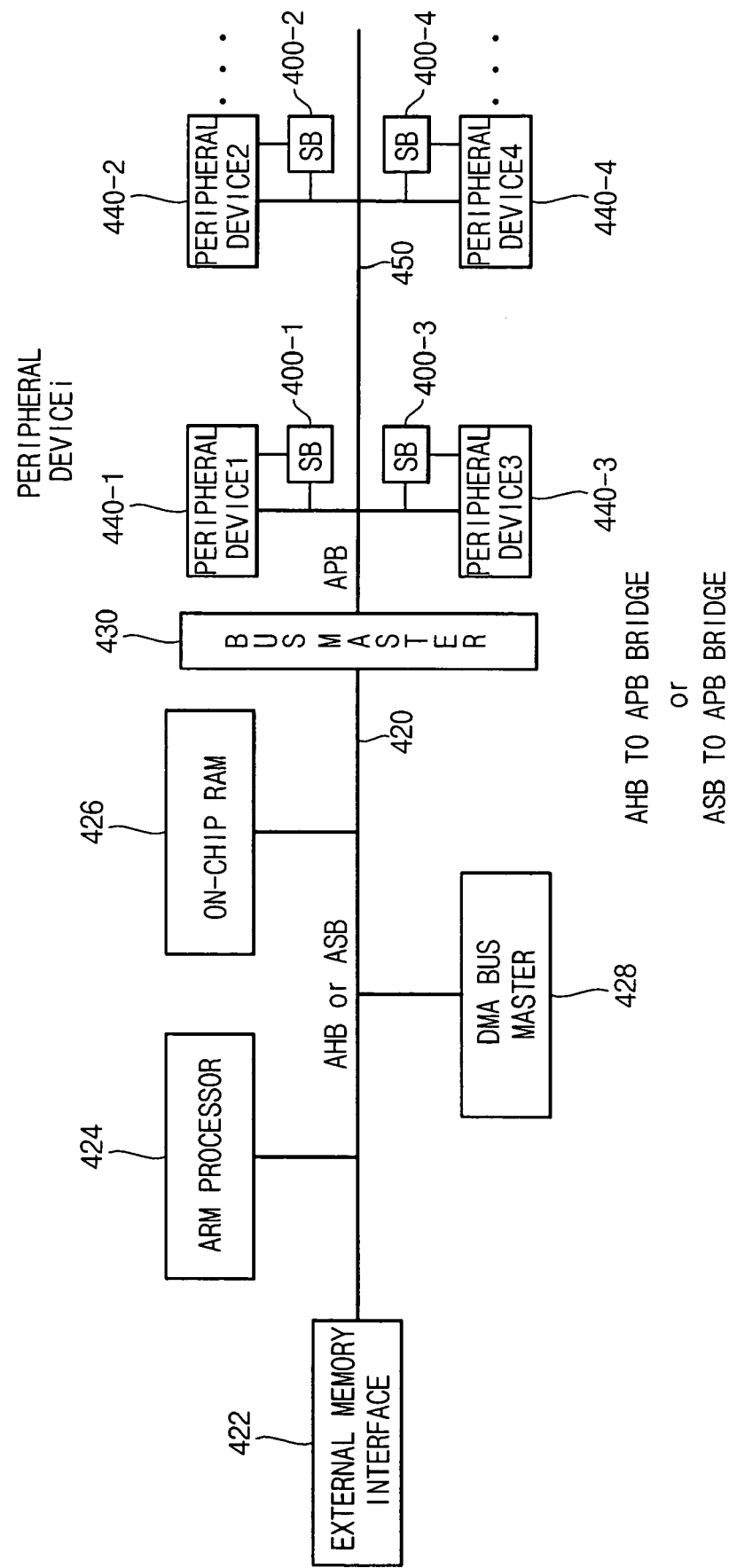
FIG. 6 is a block diagram illustrating an AMBA bus system according to an example embodiment of the present invention.

FIG. 6 is a block diagram illustrating an advanced microcontroller bus architecture (AMBA) bus system according to an example embodiment of the present invention.

Referring to FIG. 6, the AMBA bus system includes an external memory interface 422, an ARM processor 424, an on-chip memory 426, a DMA bus master 428, a main bus 420, a bus master or bridge 430, a peripheral bus 450, and a plurality of peripheral devices 440-1, 440-2, 440-3, 440-4, . . . , 440-n.

The plurality of peripheral devices 440-1, 440-2, 440-3, 440-4, . . . , 440-n may include a UART, a timer, a keypad, and a PIO.

The main bus 420 employs an AHB or an ASB, and couples the ARM processor 424, the on-chip memory 426 and the DMA bus master 428.

The AHB and the ASB are high-performance buses that provide pipeline operation, burst operation, and multiple bus masters.

The peripheral bus 450 employs an APB, and couples the plurality of peripheral devices 440-1, 440-2, 440-3, 440-4, . . . , 440-n such as the UART, the timer, the keypad and the PIO.

The APB is characterized by low power consumption, control of latched addresses, and provides a simple interface between the peripheral devices.

The bus master 430 controls data transfer between system devices such as the ARM processor 424, the on-chip memory 426 and the DMA bus master 428 coupled to the main bus 420 and the peripheral devices 440-1, 440-2, 440-3, 440-4, . . . , 440-n coupled to the peripheral bus 450.

Each of the peripheral devices 440-1, 440-2, 440-3, 440-4, . . . , 440-n may include the self-generated strobe signal generator 400-1, 400-2, 400-3, 400-4, . . . , 400-n.

That is, the number of the self-generated strobe signal generators 400 may correspond to the number of the peripheral devices.

In alternative embodiments, some of the peripheral devices may include the self-generated strobe signal generator 400 shown in FIG. 4, and the others of the peripheral devices may use the conventional strobe signal PENABLE.

The self-generated strobe signal generator 400 may be included in the peripheral devices.

Figure 7:
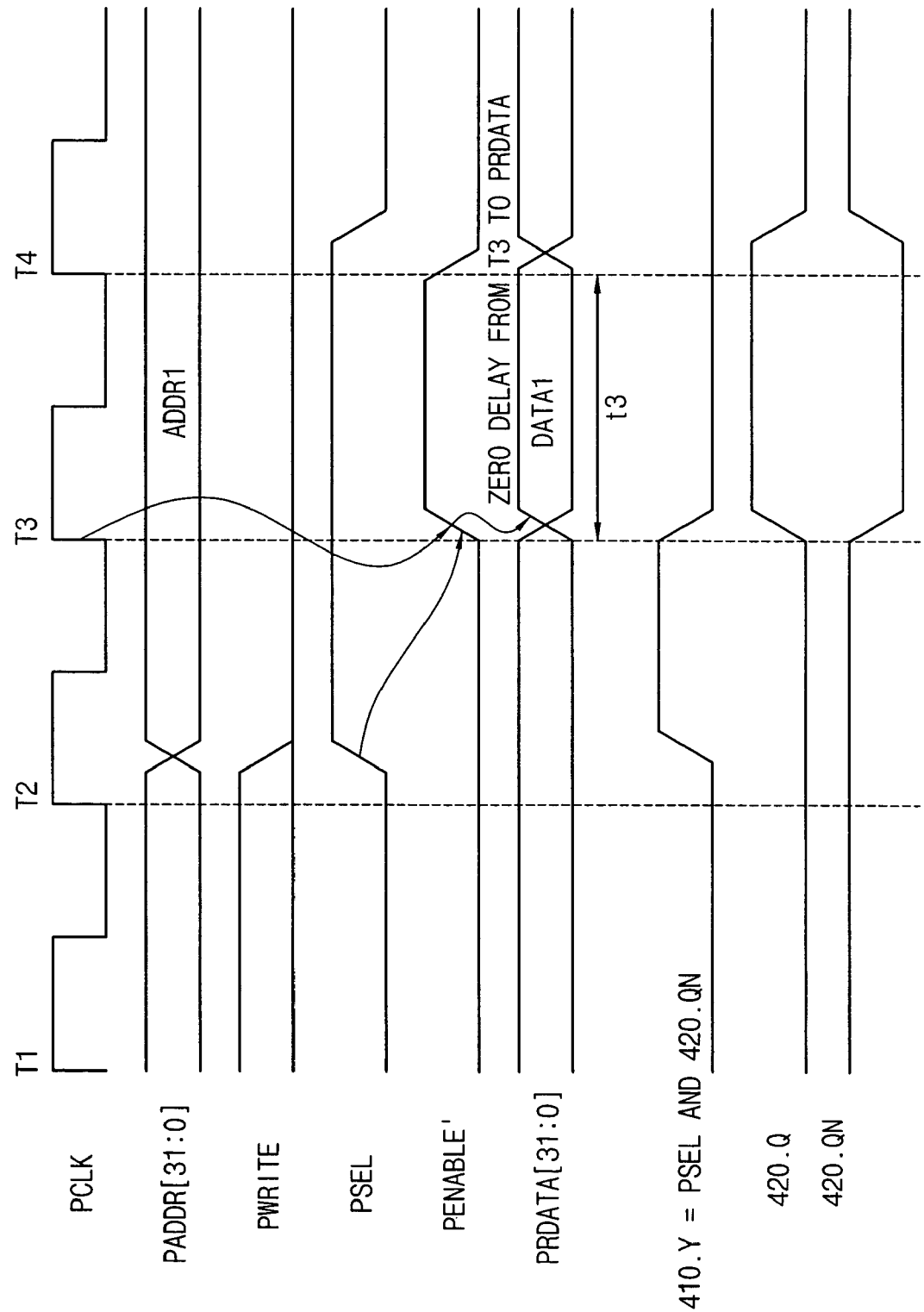
FIG. 7 is a timing diagram illustrating operation of a bus system shown in FIG. 5 during a data read mode.

FIG. 7 is a timing diagram illustrating operation of a bus system shown in FIG. 5 during a data read mode. FIG. 7 contains a timing diagram illustrating operation of the self-generated strobe signal generator 400 together with a timing diagram illustrating operation between a plurality of peripheral devices and a bus master 430 during the data read mode.

Referring to the timing diagram illustrating operation of the self-generated strobe signal generator 400, when a peripheral device selection signal PSEL is continuously inactivated (or low, disabled) during a first clock cycle T1, the output signal Y of the logical AND circuit 410 has a low state during the first clock cycle T1. As a result, the output signal Q of the D-type flip-flop 420 has a low state and an inverted signal QN, i.e., the other output signal of the D-type flip-flop 420, has a high state.

During a second clock cycle T2, in which the peripheral device is selected as a read mode, the output signal Y of the logical AND circuit 410 assumes a high state and the output signal Y having the high state is stored in a latch (not shown).

During a third clock cycle T3, the output signal Y having the high state is outputted as the self-generated strobe signal PENABLE' in response to the clock signal PCLK, i.e., the output signal Q having a high state.

At this time, the output signal Y of the logical AND circuit 410 assumes a low state due to the inverted signal QN outputted from the flip-flop 420, and is stored in the latch (not shown) of the flip-flop 420.

During a fourth clock cycle T4, the output signal Y having the low state changes a state of the self-generated strobe signal PENABLE' to a low state in response to the clock signal PCLK.

Referring to the timing diagram illustrating operation between the plurality of peripheral devices and the bus master 430 during the data read mode, the self-generated strobe signal generator 400 receives the peripheral device selection signal PSEL from the bus master 430 during the first and second clock cycles.

During the third clock cycle, the self-generated strobe signal generator 400 generates the self-generated strobe signal PENABLE' in response to the clock signal PCLK.

The conventional strobe signal PENABLE is commonly provided to all of the peripheral devices from the bus master 430; thus, a long delay time period is required in order that the conventional strobe signal PENABLE is transmitted to all of the peripheral devices.

In comparison with using the conventional strobe signal PENABLE, the delay time period due to the conventional strobe signal PENABLE may be reduced using the self-generated strobe signal PENABLE' of the invention.

Figure 1:
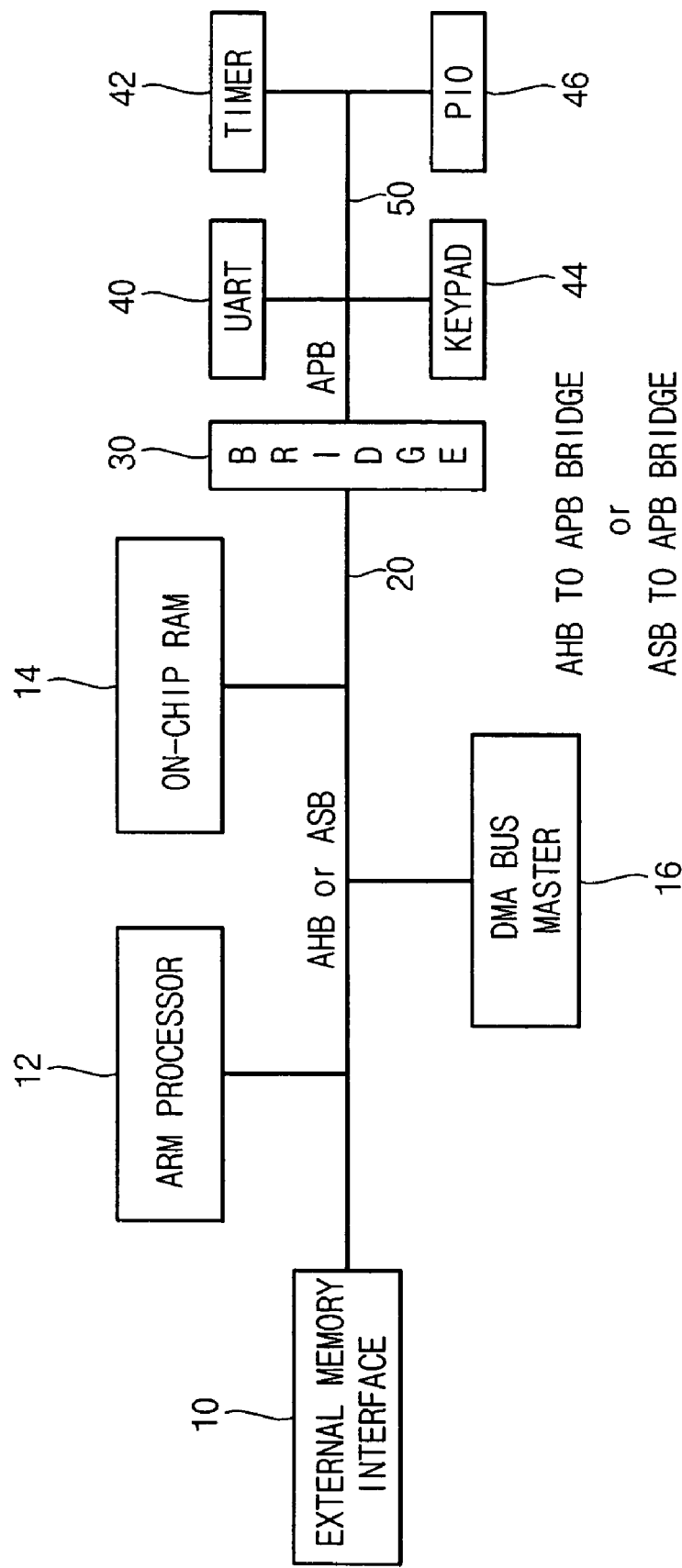
FIG. 1 is a block diagram illustrating a conventional AMBA.
Figure 2:
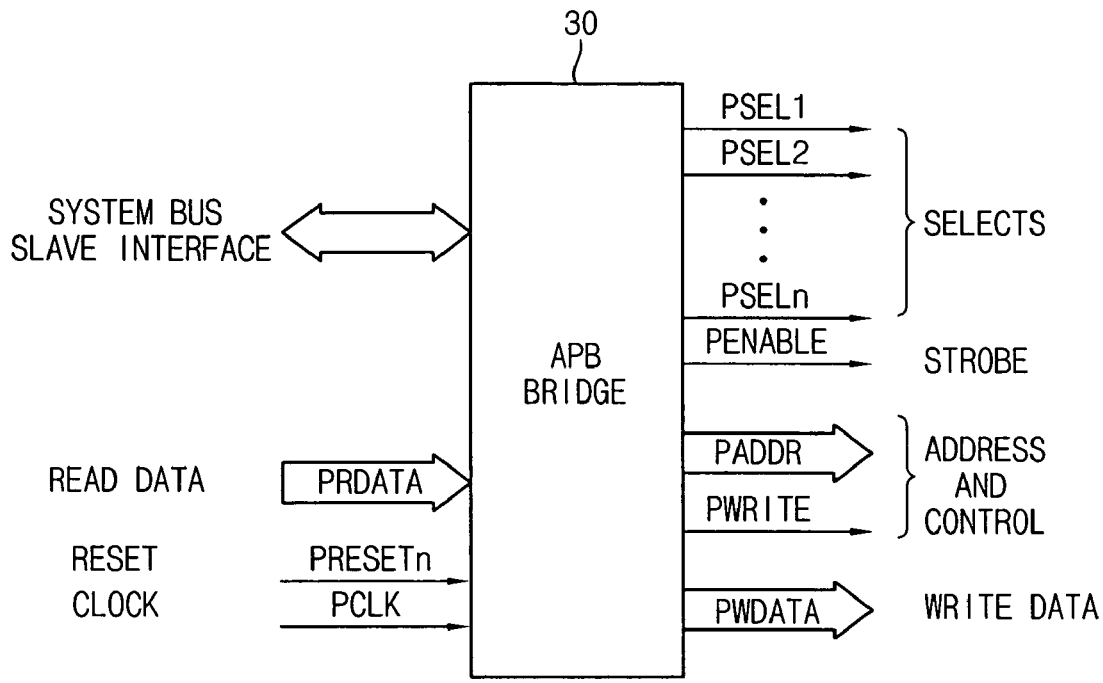
FIG. 2 is a block diagram illustrating signal transfer between a bus master (or bridge) and peripheral devices shown in FIG. 1.
Figure 2:
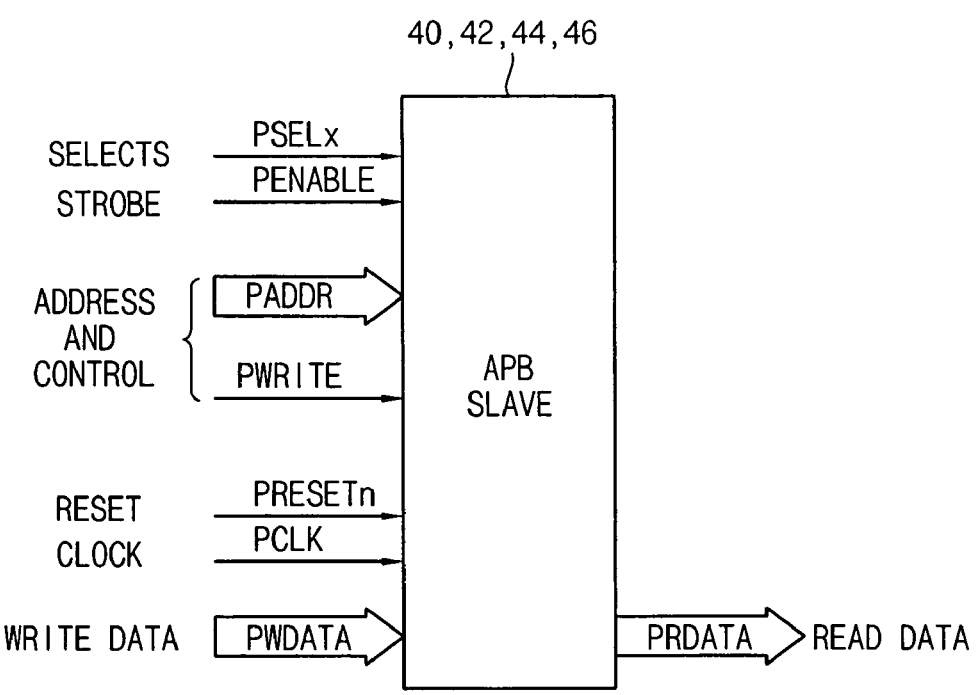
Figure 3:
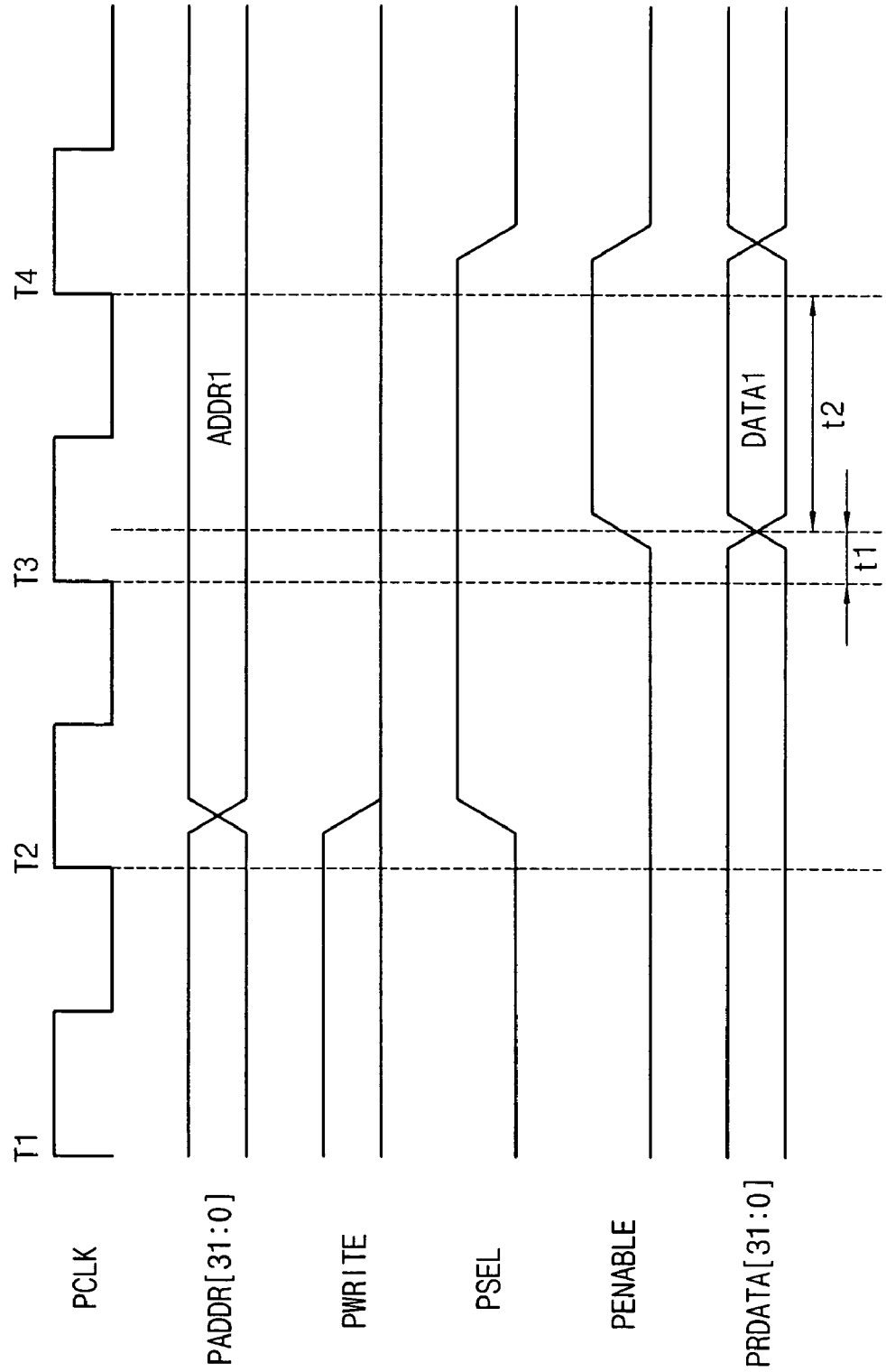
FIG. 3 is a timing diagram illustrating operation of a bus system shown in FIG. 1 during a data read mode.

As shown in FIG. 7, a set-up time period t3 may be longer and more stable than the conventional set-up time period t2 as shown in FIG. 3. In addition, the clock signal PCLK, of which the delay time is compensated to assume an identical phase, is provided to the bus master 430, the self-generated strobe signal generator 400 and all of the peripheral devices by employing a clock tree synthesizer (CTS). Therefore, the clock PCLK may control the peripheral devices more precisely and more stably.

A method of generating the self-generated strobe signal for the peripheral devices according to another example embodiment of the present invention includes a step of performing a logical AND operation on the peripheral device selection signal PSEL inputted in response to the clock signal PCLK during the second clock cycle T2 and the inverted signal of the self-generated strobe signal PENABLE' outputted from the flip-flop 420, a step of storing a result of the logical AND operation, and a step of outputting the self-generated strobe signal PENABLE' for controlling data input/output of the peripheral device using the result in response to the clock signal during the third clock cycle T3.

The self-generated strobe signal PENABLE' is activated in response to an activation of the peripheral device selection signal PSEL.

In the storing step, the self-generated strobe signal generator 400 performs the logical AND operation on the peripheral device selection signal having an active state during the second clock cycle T2 and the inverted signal having an inactive state, and then stores the result of the logical AND operation in the flip-flop 420.

In the outputting step, the self-generated strobe signal generator 400 outputs the self-generated strobe signal PENABLE' for controlling data input/output of a peripheral device using the result in response to the clock signal PCLK during the third clock cycle T3.

As described above, the delay time period due to the high fan-out requirement and the long path length may be reduced and an operating frequency of an entire system may be improved using the self-generated strobe signal PENABLE' synchronized to the clock signal PCLK, in accordance with the invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bus system comprising:
   a bus master, coupled between a main bus and a peripheral bus, the bus master generating a peripheral device selection signal, a read/write mode control signal and an address signal in response to a clock signal, the peripheral device selection signal transferring data between the main bus and a plurality of peripheral devices coupled to the peripheral bus; and
   a self-generated strobe signal generator that receives the peripheral device selection signal and the clock signal and generates a self-generated strobe signal to control data input/output of the plurality of the peripheral devices in response to the peripheral device selection signal and the clock signal, wherein the self-generated strobe signal generator comprises:
      a logical AND circuit configured to operate in response to the peripheral device selection signal and an inverted signal of the self-generated strobe signal; and
      a flip-flop configured to receive an output signal of the logical AND circuit, and configured to operate in response to the clock signal.

2. The bus system of claim 1, wherein the self-generated strobe signal is provided only to the peripheral device selected by the peripheral device selection signal.

3. The bus system of claim 1, wherein the self-generated strobe signal generator receives the peripheral device selection signal during a first clock cycle of the clock signal, and generates the self-generated strobe signal in response to a second clock cycle of the clock signal, the second clock cycle following the first clock cycle.

4. A self-generated strobe signal generator comprising:
   a logical AND circuit that receives a peripheral device selection signal and an inverted signal of a self-generated strobe signal; and
   a flip-flop that receives an output signal of the logical AND circuit to operate in response to a clock signal and generates the self-generated strobe signal and the inverted signal of the self-generated strobe signal that are used for controlling data input/output of a peripheral device that is connected to a peripheral bus, and that is selected by the peripheral device selection signal.

5. The self-generated strobe signal generator of claim 4, wherein the peripheral device selection signal is inputted during a first clock cycle of the clock signal, and the self-generated strobe signal is generated during a second clock cycle following the first clock cycle.

6. A method of generating a self-generated strobe signal for peripheral devices, the method comprising:
   performing a logical AND operation on a peripheral device selection signal and an inverted signal of a self-generated strobe signal to store a signal resulting from the logical AND operation, the peripheral device selection signal being synchronized with a first clock cycle of a clock signal; and
   outputting the self-generated strobe signal for controlling data input/output of a peripheral device that is connected to a peripheral bus using the stored signal in response to the clock signal during a second clock cycle following the first clock cycle.

7. The method of claim 6, wherein the self-generated strobe signal is activated in response to an activation of the peripheral device selection signal.

8. The method of claim 6, wherein the signal resulting from the logical AND operation is stored in a flip-flop after performing the logical AND operation on the peripheral device selection signal and the inverted signal in an inactive state during the first clock cycle.

9. The method of claim 6, wherein the self-generated strobe signal is provided only to the peripheral device selected by the peripheral device selection signal.

10. The method of claim 6, wherein the peripheral device selection signal is provided from a bus master, and the clock signal, which is used as a common clock signal during the step of storing the signal resulting from the logical AND operation and during the step of outputting the self-generated strobe signal, is used as the common clock signal of the bus master and the peripheral device selected by the peripheral device selection signal.

* * * * *